(12) United States Patent
Dutartre

(10) Patent No.: US 11,757,054 B2
(45) Date of Patent: Sep. 12, 2023

(54) INTEGRATED OPTICAL SENSOR WITH PINNED PHOTODIODES

(71) Applicant: STMicroelectronics (Crolles 2) SAS, Crolles (FR)

(72) Inventor: Didier Dutartre, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 204 days.

(21) Appl. No.: 17/324,619

(22) Filed: May 19, 2021

(65) Prior Publication Data

US 2021/0376170 A1  Dec. 2, 2021

(30) Foreign Application Priority Data

May 26, 2020 (FR) ...................... 2005537

(51) Int. Cl.
*H01L 31/028* (2006.01)
*G01S 7/4865* (2020.01)
*H01L 27/146* (2006.01)
*H01L 31/103* (2006.01)

(52) U.S. Cl.
CPC .......... *H01L 31/028* (2013.01); *G01S 7/4865* (2013.01); *H01L 27/14649* (2013.01); *H01L 31/1037* (2013.01)

(58) Field of Classification Search
CPC ............... H01L 31/028; H01L 31/1037; H01L 31/1812; H01L 27/14649; G01S 7/4865
See application file for complete search history.

(56) References Cited

U.S. PATENT DOCUMENTS

| 2005/0006565 A1* | 1/2005 | Mouli | H01L 27/14603 |
| | | | 250/214.1 |
| 2006/0157806 A1* | 7/2006 | Rhodes | H01L 31/028 |
| | | | 257/E31.011 |
| 2011/0240121 A1* | 10/2011 | Dalal | H01L 31/035245 |
| | | | 136/258 |

(Continued)

FOREIGN PATENT DOCUMENTS

WO   2019089437 A1   5/2019

OTHER PUBLICATIONS

Fossum et. al. "A Review of the Pinned Photodiode for CCD and CMOS Image Sensors" IEEE Journal of the Electron Devices Society, vol. 2, No. 3, May 2014 (Year: 2014).*

(Continued)

*Primary Examiner* — Sitaramarao S Yechuri
(74) *Attorney, Agent, or Firm* — CROWE & DUNLEVY

(57) ABSTRACT

An integrated optical sensor is formed by a pinned photodiode. A semiconductor substrate includes a first semiconductor region having a first type of conductivity located between a second semiconductor region having a second type of conductivity opposite to the first type one and a third semiconductor region having the second type of conductivity. The third semiconductor region is thicker, less doped and located deeper in the substrate than the second semiconductor region. The third semiconductor region includes both silicon and germanium. In one implementation, the germanium within the third semiconductor region has at least one concentration gradient. In another implementation, the germanium concentration within the third semiconductor region is substantially constant.

80 Claims, 3 Drawing Sheets

(56) References Cited

U.S. PATENT DOCUMENTS

| | | |
|---|---|---|
| 2015/0200223 A1 | 7/2015 | Lee |
| 2015/0349160 A1* | 12/2015 | Cheng ............. H01L 31/035254 |
| | | 257/463 |
| 2016/0161599 A1* | 6/2016 | Seliuchenko ....... H01L 27/1463 |
| | | 250/338.4 |
| 2018/0145099 A1* | 5/2018 | Yang ................. H01L 27/14645 |
| 2020/0075793 A1 | 3/2020 | Cheng et al. |
| 2021/0343882 A1* | 11/2021 | Iesaka ................... H01L 31/105 |

OTHER PUBLICATIONS

Fossum Eric R et al "A Review of the Pinned Photodiode for CCD and CMOS Image Sensors" IEEE Journal of the Electron Devices Society vol. 2 No. 3 May 1, 2014 pp. 33-43.

INPI Search Report and Written Opinion for FR 2005537 dated Feb. 8, 2021 (9 pages).

* cited by examiner

INTEGRATED OPTICAL SENSOR WITH PINNED PHOTODIODES

PRIORITY CLAIM

This application claims the priority benefit of French Application for Patent No. 2005537, filed on May 26, 2020, the content of which is hereby incorporated by reference in its entirety to the maximum extent allowable by law.

TECHNICAL FIELD

Implementations and embodiments relate to integrated optical sensors, in particular those including pinned photodiodes.

BACKGROUND

In recent years, an increasing number of applications (such as facial recognition, virtual reality, and active automotive safety) require high performance, low-profile and low cost imaging systems.

In this regard, imaging systems based on the use of indirect Time of Flight (iToF) measurement techniques, and benefiting from a highly integrated structure and precise and rapid performance, meet these expectations particularly well.

More specifically, with a periodic modulated excitation obtained from a laser, for example, it is possible to indirectly measure the distance separating an object to be measured and the imaging system, called "iToF" imaging system, via a phase shift measurement of the signal received after the reflection on the object relative to the emitted radiation and to extend a data collection of the optical signal over several excitation and emission cycles so as to improve the accuracy of the measurement.

This type of detector is particularly used for applications using radiation whose wavelength is in the near infrared (for example, 0.94 micrometers).

And such, these applications, implemented in particular not only in time of flight sensors but also in CMOS imagers, are increasingly numerous.

Generally, the sensors used are integrated silicon-based sensors.

However, silicon has a low absorption power in the infrared and even in the near infrared (0.94 micrometers, for example). For example, a 1 micrometer thick silicon substrate has 1.7% absorption at 0.94 micrometer wavelength.

This absorption power is increased with greater thicknesses, for example of the order of 6 micrometers, which are typical thicknesses of pinned photodiodes of integrated optical sensors.

But silicon devices have low sensitivity in the near infrared. For example, a 6 micrometer thick silicon substrate has a quantum efficiency in the range of 7% to 8% at 0.94 micrometer wavelength.

Furthermore, with such thicknesses, the collection of minority carriers in the pinned photodiode is very slow, which is detrimental.

There is consequently a need to improve the performance of an optical sensor implementing in particular one or more pinned photodiodes, most particularly in the near infrared range, in particular in terms of absorption and/or sensitivity and/or speed of collection of minority carriers.

SUMMARY

It is possible to meet the foregoing needs by replacing silicon with a material having in particular better infrared absorption while meeting strict constraints such as, for example: a compatibility with microelectronic components located on the front-end of a substrate as well as with monocrystalline silicon; integrability in the active part of semiconductor devices (diodes and pinned diodes); a sufficiently small generation of minority carriers; and as low defectiveness as possible.

Such a material is then advantageously resistant to temperature, having good interface quality with silicon and with dielectric materials such as silicon dioxide and generally having a good quality (in particular no or very few dislocations, no or very few contaminants).

A pinned photodiode includes within a semiconductor substrate, a first semiconductor region, for example of N type, sandwiched between two semiconductor regions, for example a surface region of P+ type and a thicker and deeper region of P type.

It is, for example, proposed to incorporate germanium in the P-type region in an amount which is not too large so as to improve the performance of the optical sensor in particular in the near infrared range, in particular in terms of absorption and sensitivity, while minimizing the risk of dislocation formations.

Moreover, it is also proposed, for example, to incorporate germanium in the P-type region having a positive concentration gradient from the bottom of the P region to the N region, so as to improve the performance of the optical sensor, in particular in the near infrared range, particularly in terms of speed of collection of minority carriers.

In the two cases mentioned above (not too large, for example constant, amount of germanium and positive concentration gradient) the germanium concentration profile preferably stops at the start of the depleted area of the P region.

Thus, according to one aspect, an integrated optical sensor is proposed, comprising at least one detection module including a pinned photodiode.

The photodiode includes within a semiconductor substrate, a first semiconductor region having a first type of conductivity, for example the N type of conductivity, located between a second semiconductor region having a second type of conductivity, for example the P type of conductivity, opposite to the first one and a third semiconductor region also having the second type of conductivity.

This third region is thicker than the second region.

This third region is less doped than the second region. Thus, this third region can be P doped while the second region can be P+ doped.

This third region is moreover located deeper in the substrate than the second region.

This third region includes silicon and germanium, advantageously in a small amount or atomic percentage, for example with an atomic percentage comprised between 3 and 6%, and preferably having at least a first concentration gradient.

The first concentration gradient is advantageously a positive gradient, the atomic percentage of germanium increasing towards the first region.

The presence of germanium allows to improve the absorption coefficient of the semiconductor material.

Moreover, the presence of an advantageously positive concentration gradient allows to reduce the space between the valence band and the conduction band of the semiconductor material and leads to an inclination of the conduction band towards the surface of the photodiode, which will lead to obtaining an electric field which will accelerate the movement of the minority carriers from the third region to the first region.

The duration of collection of minority carriers is consequently reduced.

The atomic percentage of germanium preferably increases from 0% to 6%.

Limiting the atomic percentage of germanium to 6% furthermore allows to limit the risk of dislocation appearance and generally allows the detection module to remain compatible with the other steps of manufacturing the optical sensor and the other components of the integrated circuit incorporating the optical sensor.

Moreover, this growth can take place in any possible manner, for example linearly or in step(s).

The third region generally includes a depleted area and a non-depleted area (called a neutral area), the depleted area being in contact with the first region and located above the non-depleted area, and the first concentration gradient is preferably located in the non-depleted area.

Furthermore, it is also preferable that the germanium has a second negative concentration gradient in the depleted area.

This negative gradient of germanium concentration indeed creates an electric field opposite to that resulting from the inclination of the conduction band.

By placing the negative germanium gradient in the depleted area, it becomes negligible compared to the electric field created by the diode itself.

For example, the atomic percentage of germanium can decrease from 6% to 0% in the depleted area.

The decrease in the atomic percentage of germanium according to the second gradient can be gradual or else abrupt (second "infinite" gradient) although softened in practice by the phenomena of inter-diffusion of germanium and silicon atoms.

According to another aspect, provision is made of an integrated optical sensor, comprising at least one pinned photodiode including within a semiconductor substrate, a first semiconductor region having a first type of conductivity located between a second semiconductor region having a second type of conductivity opposite to the first one and a third semiconductor region having the second type of conductivity, which is thicker, less doped and located deeper in the substrate than the second region, and including silicon and germanium having an atomic percentage less than or equal to 6%, for example comprised between 3% and 6%.

Indeed, as indicated above, independently of the presence of a germanium concentration gradient, the presence of germanium in a small amount allows to improve the absorption coefficient while minimizing the risk of the dislocation appearance and generally allows the detection module to remain compatible with the other manufacturing steps of the optical sensor and of the other components of the integrated circuit incorporating the optical sensor.

According to one embodiment, the non-depleted area includes germanium having a substantially constant atomic percentage.

This constant atomic percentage of germanium is for example comprised between 4% and 5%.

The third region may contain a silicon germanium alloy, obtained for example in the case of a gradient by a ramp on the concentrations of dopants (germanium) in an epitaxy reactor, or an alternation of layers of silicon and layers of silicon-germanium.

As stated above, the first conductivity type can be the N type and the second conductivity type can be the P type, but the reverse is also possible.

According to one embodiment, the substrate can be a substrate of the silicon-on-insulator type, including a buried insulating layer, known to a person skilled in the art by the acronym BOX ("Buried Oxide"), topped by a semiconductor film, this semiconductor film containing said pinned photodiode.

The sensor can include several detection modules arranged in rows or in a matrix, for example.

According to another aspect, an imaging system is proposed, for example a camera, including at least one sensor as defined above.

According to another aspect, an electronic device is proposed, for example of the tablet or mobile cellular telephone type, including at least one imaging system as defined above.

According to another aspect, provision is made of a method for manufacturing an integrated pinch photodiode, for example in the context of manufacturing an integrated optical sensor incorporating such photodiodes, comprising an embodiment within a semiconductor substrate, of first, second and third semiconductor regions, the first semiconductor region having a first conductivity type, for example the N type of conductivity, and being located between the second semiconductor region having a second conductivity type, for example the P type of conductivity, opposite to the first one and the third semiconductor region also having the second type of conductivity, which is thicker and less doped than the second region and located deeper in the substrate than the second region.

According to one variant of this aspect, the production of the third region comprises forming a material including silicon and germanium, advantageously in a small amount or atomic percentage, for example with an atomic percentage comprised between 3% and 6%, and having preferably at least a first concentration gradient.

According to another variant of this aspect, the production of the third region comprises forming a material including silicon and germanium having an atomic percentage less than or equal to 6%, for example comprised between 3% and 6%.

Regardless of the variant, the formation of said material may comprise a silicon-germanium epitaxy or else successive epitaxies of silicon and of silicon-germanium.

BRIEF DESCRIPTION OF THE DRAWINGS

Other advantages and features of the invention will become apparent upon examination of the detailed description of embodiments and implementations, and of the appended drawings wherein.

DETAILED DESCRIPTION

Figure 1:
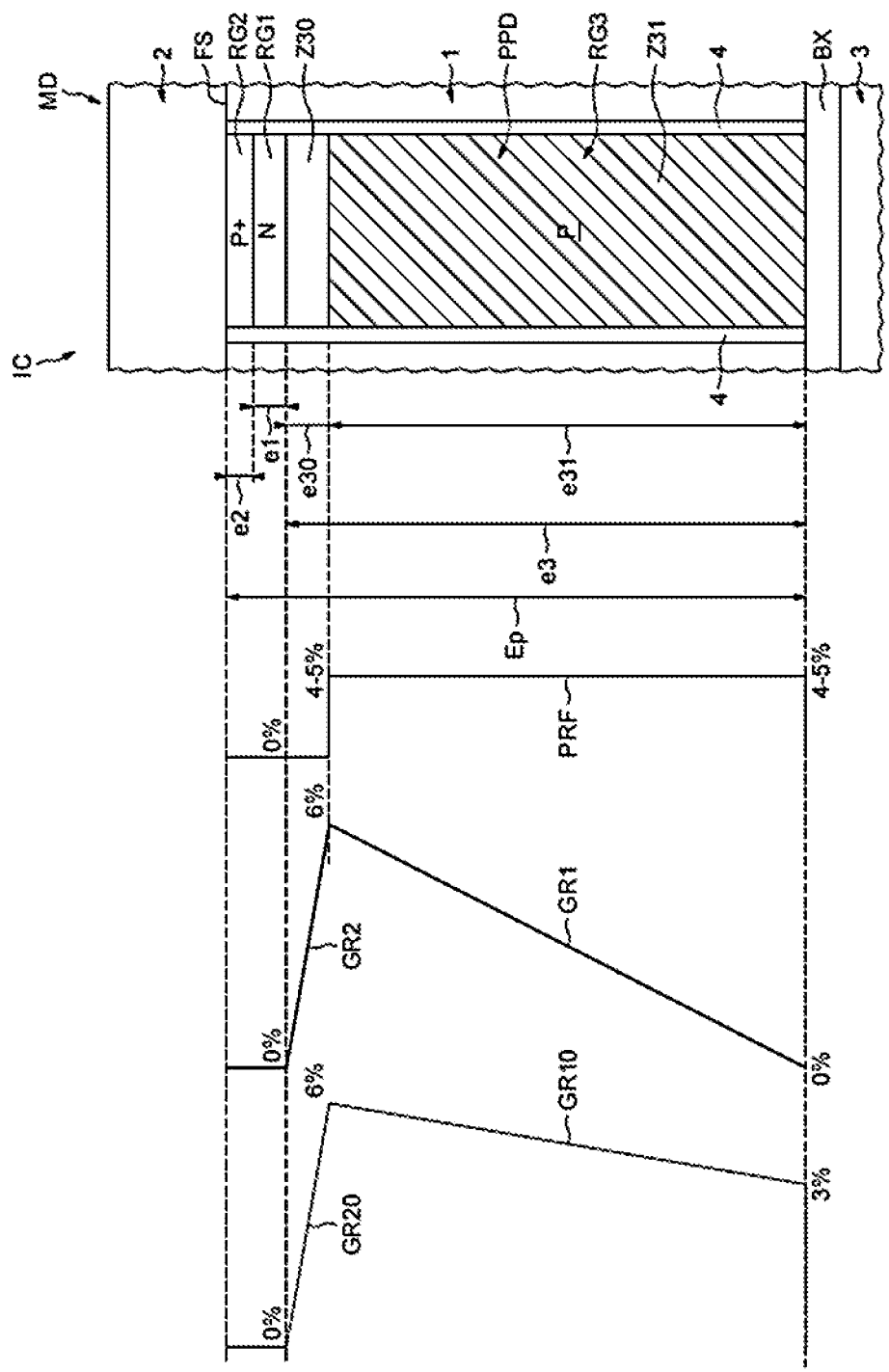
FIG. 1 illustrates a cross-section of a pinned photodiode located within a semiconductor substrate, and further illustrates dopant concentration information.

On the right part of FIG. 1, the reference MD generally designates a detection module including a pinned photodiode PPD located within a semiconductor substrate which is here a Silicon on Insulator (SOI) type substrate.

The module MD is integrated within an integrated circuit IC.

The SOI-type substrate includes a semiconductor film 1 located above a buried insulating layer BX, in turn located above a carrier substrate 3.

The thickness Ep of the semiconductor film 1 can be comprised between about 3 and 6 micrometers and is in this example of the order of 6 micrometers.

The photodiode PPD is a buried photodiode formed by a double junction, here a double P+NP junction.

It is here electrically insulated from the rest of the semiconductor film 1 by deep insulation trenches 4.

More specifically, the photodiode PPD includes, within the semiconductor film 1, a first semiconductor region RG1 having the N type of conductivity located between a second semiconductor region RG2, or pinning implant, having the P type of conductivity and a third semiconductor region RG3 having the P type of conductivity.

The first region RG1 can advantageously be formed in the center of the module and not extend to the deep insulation trenches 4.

The second region RG2 has a thickness e2 of the order of 0.07 micrometers.

It is P+ doped with a dopant concentration of around $10^{20}$ atoms/cm$^3$.

This pinning implant allows to greatly reduce the dark current of the detection module MD.

The first region RG1 has a thickness e1 of the order of 0.3 micrometers.

It is N doped with a dopant concentration of around $2*10^{17}$ atoms/cm$^3$.

The third region RG3 has a thickness e3 of the order of 6 micrometers.

It is less doped and located deeper in the substrate than the second region RG2.

It is P doped with a dopant concentration comprised in the range $10^{14}$-$10^{15}$ atoms/cm$^3$.

This third region RG3 can be very lightly doped over more than 90% of its thickness but can include a more heavily doped P layer ($10^{17}$-$10^{18}$ atoms/cm$^3$) of P type at its base, that is to say here adjacent to or on the buried insulating layer BX.

The third region RG3 includes a depleted area Z30 in contact with the first region RG1, and a non-depleted area Z31 under the depleted area Z30.

The depleted area Z30 has a thickness e30 of the order of 2-3 micrometers, the doping of which corresponds to the superposition of the P doping of the non-depleted area Z31 (in the range $10^{14}$-$10^{15}$ atoms/cm$^3$) with the "tail" of the N doping of the second region RG2.

The non-depleted area Z31 has a thickness e31 of the order of 3 to 4 micrometers and as indicated above a dopant concentration of the order of $10^{14}$-$10^{15}$ atoms/cm$^3$.

The module MD moreover includes above the upper face FS of the semiconductor film 1, a part 2 including the processing circuit (of conventional structure and known per se) of the photodiode allowing in particular the collection of the minority carriers accumulated in the first region N, as well as the interconnection region known to a person skilled in the art by the acronym BEOL ("Back End Of Line").

As illustrated on the left part of FIG. 1, the third region RG3 includes silicon and germanium which may have different concentration profiles.

Thus according to a first embodiment, the germanium concentration can have the profile PRF corresponding to a substantially constant germanium concentration, preferably in the non-depleted area Z31. In this context, substantially constant means within +/−1-3% of a target dopant concentration level throughout the region of interest (i.e., the area Z31).

As an example, the atomic percentage of germanium is of the order of 4% to 5% over the entire thickness of the non-depleted area Z31, then abruptly drops to 0 at the depleted area Z30.

This presence of germanium in small amounts, typically with an atomic percentage of germanium less than 6% in the third region RG3, allows in particular to improve the absorption coefficient while minimizing the risk of dislocation appearance.

Nevertheless, the third region RG3 may include silicon and germanium advantageously having a first concentration gradient GR1 (or GR10) and a second concentration gradient GR2 (or GR20).

The gradients GR1, GR2, GR10 and GR20 are possible, but not limiting, examples.

The first concentration gradient GR1 or GR10 is a positive gradient, meaning that the atomic percentage of germanium increases from the buried oxide layer BX towards the first region RG1.

Regarding the gradient GR1, the atomic percentage of germanium increases from 0% to 6% from the bottom of the non-depleted area Z31 to the limit with the depleted area Z30.

Regarding the gradient GR10, the atomic percentage of germanium increases, for example, from 3% to 6% from the bottom of the non-depleted area Z31 to the limit with the depleted area Z30.

The second germanium concentration gradient GR2 or GR20 located in the depleted area Z30 is a negative gradient, meaning that the atomic percentage of germanium decreases from the limit with the depleted area Z30 towards the first region RG1.

More specifically, the atomic percentage of germanium decreases from 6% to 0% in the depleted area Z30 for each of the second germanium concentration gradients GR2 or GR20.

Alternatively, this second gradient could be "infinite" which corresponds to an abrupt transition, here from 6% to 0% (similar to that illustrated with respect to the change for the profile PRF).

Nevertheless, in practice this abrupt transition is softened by the inter-diffusion phenomena of the germanium and silicon atoms.

The presence of the concentration gradient GR1 or GR10 allows to reduce the space between the valence band and the conduction band of the semiconductor material and leads to an inclination of the conduction band towards the surface of the photodiode, which will lead to obtaining an electric field which will accelerate the movement of minority carriers from the third region to the first region and consequently decrease the duration of collection of minority carriers.

However, the second germanium concentration gradient creates an electric field opposite to that of the first gradient.

By placing this second negative gradient of germanium GR2 or GR20 in the depleted area Z30, it becomes negligible compared to the electric field created by the diode itself.

Consequently, the duration of the collection of minority carriers will not be negatively affected.

Moreover, here again, the presence of germanium in small amounts, for example with an average atomic percentage comprised between 3% and 6%, allows to improve the absorption coefficient while minimizing the risk of the dislocation appearance.

The embodiment of FIG. 1 providing for the presence of gradients of germanium concentrations, therefore allows a rapid detection modulus to be obtained with an improved absorption coefficient and a reduced risk of dislocations.

Figure 2:
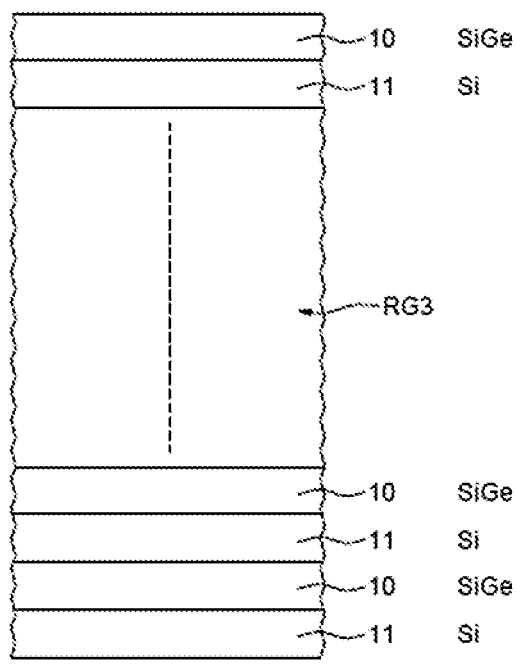
FIG. 2 illustrates a cross-section of a pinned photodiode located within a semiconductor substrate, and further illustrates alternation of doped layers.

While in the embodiment of FIG. 1, the third region RG3 is formed of a homogeneous silicon-germanium alloy, it may be formed, as illustrated in FIG. 2, of an alternation of layers of silicon 11 and layers of silicon-germanium 10.

The percentage by volume of germanium for each of these layers 11 is selected so that the final atomic percentage of germanium in the region RG3 follows the considered gradients.

An embodiment of a method for manufacturing the module MD of FIG. 1 will now be described.

In the case of an SOI-type substrate, an epitaxy is carried out above the buried layer BX (and where appropriate the thin layer of silicon which is more heavily doped forming the base of the third region RG3), so as to form the third region RG3 comprising silicon and germanium.

A silicon-germanium epitaxy is a step well known to a person skilled in the art.

As an example, SiGe epitaxy can be performed by chemical vapor deposition (CVD) using dichlorosilane+germanium+hydrogen chemistry at 900-950° C. and reduced pressure (10-60 Torr).

Low partial pressures of diborane ($B_2H_6$) can also be added to obtain the P doping.

In order to obtain the desired concentration gradients for germanium, the amounts of germanium can be adjusted in the epitaxy reactor so that they follow ramps.

The SiGe epitaxy is then continued by another epitaxy, this time only silicon epitaxy, which is conventional and known per se, so as to form after localized ion implantation of N-type dopants the first region RG1, then after localized implantation of P-type dopants, the second P+ doped region RG2.

As an example, the conditions for this other epitaxy are substantially the same as those used for SiGe epitaxy, optionally with a temperature increased from 50 to 100° C.

It should be noted that these two epitaxies often carried out at the same step can be carried out in the same epitaxy operation, and therefore in the same epitaxy reactor and with the same recipe, and therefore often without cooling of the wafer between the two types of depositions.

As regards the production of the third region RG3 as illustrated in FIG. 2, in this situation, successive epitaxies of silicon and silicon-germanium are carried out, so as to obtain the stacking of layers 11 and 10.

The percentage by volume of germanium for each of these epitaxies is selected so that the average final percentage of germanium by volume is comprised between 3% and 6% and where appropriate follows the considered concentration gradients.

Then regardless of the variant used, the production is continued by forming deep trenches and shallow trenches as well as the conventional formation of the other components of the detection module.

It would also be possible, instead of performing these full wafer epitaxies, to perform a first full wafer silicon epitaxy to form the silicon film 1, then to locally etch the semiconductor film in the area where the detection module is produced (corresponding to the pixel), and then proceed with the SiGe and Si epitaxies and the implantations mentioned above, then to the production of the insulation trenches and of the various electronic components of the module MD.

Moreover, everything that has just been described for an SOI-type substrate applies to a solid (i.e., Bulk) substrate.

Figure 3:
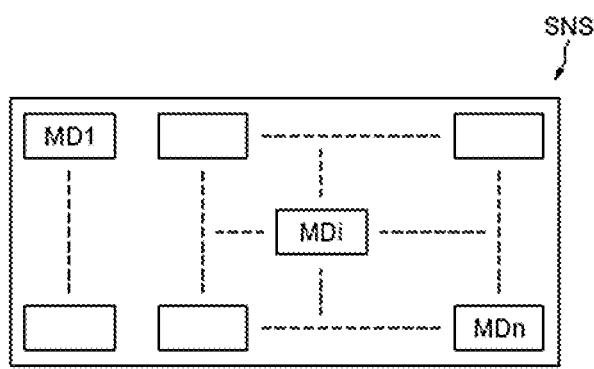
FIG. 3 schematically illustrates an integrated optical sensor.

As illustrated in FIG. 3, the integrated optical sensor SNS can include several detection modules MD1-MDn arranged for example in rows or in a matrix.

Figure 4:
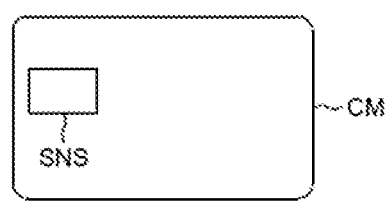
FIG. 4 schematically illustrates imaging system including the integrated optical sensor.
Figure 5:
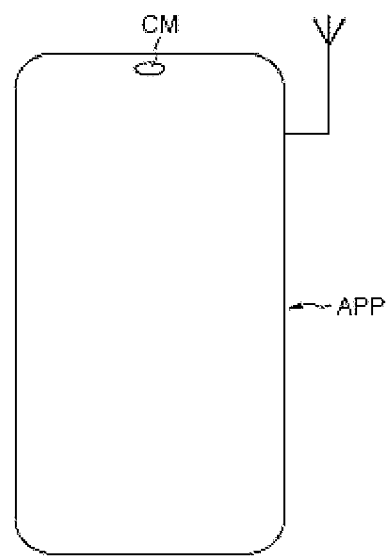
FIG. 5 schematically illustrates an electronic device including the integrated optical sensor.

As illustrated in FIG. 4, the sensor SNS can be incorporated within an imaging system CM, for example a camera which in turn can be incorporated within an electronic device APP (FIG. 5) for example of the tablet or cellular mobile phone type.

The invention claimed is:

1. An integrated optical sensor including a pinned photodiode, comprising:
    a semiconductor substrate including:
        a first semiconductor region having a first type of conductivity;
        a second semiconductor region having a second type of conductivity opposite to the first type of conductivity; and
        a third semiconductor region having the second type of conductivity;
        wherein said first semiconductor region is located between the second and third semiconductor regions;
        wherein said third semiconductor region is thicker, less doped and located deeper in the semiconductor substrate than the second semiconductor region;
        wherein said third semiconductor region includes silicon and germanium, with the germanium having a first concentration gradient; and
        wherein the third semiconductor region is formed by an alternation of layers of silicon and layers of silicon-germanium.

2. The sensor according to claim 1, wherein the first concentration gradient is a positive gradient, with an atomic percentage of germanium in said third semiconductor region increasing from a bottom of the third semiconductor region towards the first semiconductor region.

3. The sensor according to claim 2, wherein the atomic percentage of germanium for said first concentration gradient increases from 0% to 6%.

4. The sensor according to claim 2, wherein the atomic percentage of germanium for said first concentration gradient increases from 3% to 6%.

5. The sensor according to claim 1, wherein the third semiconductor region includes a depleted area and a non-depleted area, said depleted area being in contact with the first semiconductor region and located above the non-depleted area, and wherein the first concentration gradient is located in the non-depleted area.

6. The sensor according to claim 5, wherein the first concentration gradient is a positive gradient, with an atomic percentage of germanium in said non-depleted area increasing from a bottom of the non-depleted area towards the depleted area.

7. The sensor according to claim 6, wherein the atomic percentage of germanium for said first concentration gradient increases from 0% to 6%.

8. The sensor according to claim 6, wherein the atomic percentage of germanium for said first concentration gradient increases from 3% to 6%.

9. The sensor according to claim 5, wherein said third semiconductor region further includes silicon and germanium in the depleted area, with the germanium having a second concentration gradient, wherein said second concentration gradient is a negative concentration gradient, with an atomic percentage of germanium in said depleted area decreasing from the non-depleted area towards the first semiconductor region.

10. The sensor according to claim 9, wherein the atomic percentage of germanium decreases from 6% to 0% in the depleted area.

11. The sensor according to claim 5, wherein said depleted area in the third semiconductor region does not include germanium.

12. The sensor according to claim 1, wherein the third semiconductor region contains a silicon germanium alloy.

13. The sensor according to claim 1, wherein the first type of conductivity is N type and the second type of conductivity is P type.

14. The sensor according to claim 1, wherein the semiconductor substrate is a silicon-on-insulator type substrate which includes a buried insulating layer topped by a semiconductor film, and wherein said pinned photodiode is contained within said semiconductor film.

15. The sensor according to claim 1, including at least one detection module which includes said pinned photodiode.

16. The sensor according to claim 1, wherein said pinned photodiode is a component of an imaging system.

17. The sensor according to claim 16, wherein said imaging system is a Time of Flight (ToF) system.

18. The sensor according to claim 16, wherein said imaging system is a component of an electronic device.

19. The sensor according to claim 18, wherein the electronic device is selected from a group consisting of: a tablet and a cellular mobile phone.

20. An integrated optical sensor including a pinned photodiode, comprising:
 a semiconductor substrate including:
  a first semiconductor region having a first type of conductivity;
  a second semiconductor region having a second type of conductivity opposite to the first type of conductivity; and
  a third semiconductor region having the second type of conductivity;
 wherein said first semiconductor region is located between the second and third semiconductor regions;
 wherein said third semiconductor region is thicker, less doped and located deeper in the semiconductor substrate than the second semiconductor region;
 wherein said third semiconductor region includes silicon and germanium having a substantially constant atomic percentage of germanium that is less than or equal to 6%;
 wherein the third semiconductor region includes a depleted area and a non-depleted area, the depleted area being in contact with the first semiconductor region and located above the non-depleted area, and the non-depleted area includes germanium having said substantially constant atomic percentage; and
 wherein the depleted area does not include germanium.

21. The sensor according to claim 20, wherein the constant atomic percentage of germanium in the non-depleted area is comprised between 4% and 5%.

22. The sensor according to claim 20, wherein the constant atomic percentage of germanium is comprised between 4% and 5%.

23. The sensor according to claim 20, wherein the third semiconductor region contains a silicon germanium alloy.

24. The sensor according to claim 20, wherein the third semiconductor region is formed by an alternation of layers of silicon and layers of silicon-germanium.

25. The sensor according to claim 20, wherein the first type of conductivity is N type and the second type of conductivity is P type.

26. The sensor according to claim 20, wherein the semiconductor substrate is a silicon-on-insulator type substrate which includes a buried insulating layer topped by a semiconductor film, and wherein said pinned photodiode is contained within said semiconductor film.

27. The sensor according to claim 20, including at least one detection module which includes said pinned photodiode.

28. The sensor according to claim 20, wherein said pinned photodiode is a component of an imaging system.

29. The sensor according to claim 28, wherein said imaging system is a Time of Flight (ToF) system.

30. The sensor according to claim 28, wherein said imaging system is a component of an electronic device.

31. The sensor according to claim 30, wherein the electronic device is selected from a group consisting of: a tablet and a cellular mobile phone.

32. An integrated optical sensor including a pinned photodiode, comprising:
 a semiconductor substrate including:
  a first semiconductor region having a first type of conductivity;
  a second semiconductor region having a second type of conductivity opposite to the first type of conductivity; and
  a third semiconductor region having the second type of conductivity;
 wherein said first semiconductor region is located between the second and third semiconductor regions;
 wherein said third semiconductor region is thicker, less doped and located deeper in the semiconductor substrate than the second semiconductor region;
 wherein the third semiconductor region includes a depleted area and a non-depleted area, said depleted area being in contact with the first semiconductor region and located above the non-depleted area;
 wherein the non-depleted area of said third semiconductor region includes silicon and germanium, with the germanium having a positive concentration gradient where an atomic percentage of germanium increases from a bottom of the non-depleted area towards the depleted area; and
 wherein the depleted area includes silicon and germanium, with the germanium having a negative concentration gradient where an atomic percentage of germanium in said depleted area decreases from the non-depleted area towards the first semiconductor region.

33. The sensor according to claim 32, wherein the atomic percentage of germanium for said positive concentration gradient increases from 0% to 6%.

34. The sensor according to claim 32, wherein the atomic percentage of germanium for said positive concentration gradient increases from 3% to 6%.

35. The sensor according to claim 32, wherein the atomic percentage of germanium decreases from 6% to 0% in the depleted area.

36. An integrated optical sensor including a pinned photodiode, comprising:
- a semiconductor substrate including:
  - a first semiconductor region having a first type of conductivity;
  - a second semiconductor region having a second type of conductivity opposite to the first type of conductivity; and
  - a third semiconductor region having the second type of conductivity;
  - wherein said first semiconductor region is located between the second and third semiconductor regions;
  - wherein said third semiconductor region is thicker, less doped and located deeper in the semiconductor substrate than the second semiconductor region;
  - wherein the third semiconductor region includes a depleted area and a non-depleted area, said depleted area being in contact with the first semiconductor region and located above the non-depleted area; and
  - wherein the non-depleted area of said third semiconductor region includes silicon and germanium, with the germanium having a positive concentration gradient where an atomic percentage of germanium increases from a bottom of the non-depleted area towards the depleted area; and
  - wherein said depleted area in the third semiconductor region does not include germanium.

37. The sensor according to claim 36, wherein the atomic percentage of germanium for said positive concentration gradient increases from 0% to 6%.

38. The sensor according to claim 36, wherein the atomic percentage of germanium for said positive concentration gradient increases from 3% to 6%.

39. An integrated optical sensor including a pinned photodiode, comprising:
- a semiconductor substrate including:
  - a first semiconductor region having a first type of conductivity;
  - a second semiconductor region having a second type of conductivity opposite to the first type of conductivity; and
  - a third semiconductor region having the second type of conductivity;
  - wherein said first semiconductor region is located between the second and third semiconductor regions;
  - wherein said third semiconductor region is thicker, less doped and located deeper in the semiconductor substrate than the second semiconductor region;
  - wherein said third semiconductor region includes silicon and germanium having a substantially constant atomic percentage of germanium that is less than or equal to 6%; and
  - wherein the third semiconductor region is formed by an alternation of layers of silicon and layers of silicon-germanium.

40. The sensor according to claim 39, wherein the constant atomic percentage of germanium in the non-depleted area is comprised between 4% and 5%.

41. The sensor according to claim 39, wherein the constant atomic percentage of germanium is comprised between 4% and 5%.

42. The sensor according to claim 39, wherein the third semiconductor region contains a silicon germanium alloy.

43. The sensor according to claim 39, wherein the first type of conductivity is N type and the second type of conductivity is P type.

44. The sensor according to claim 39, wherein the semiconductor substrate is a silicon-on-insulator type substrate which includes a buried insulating layer topped by a semiconductor film, and wherein said pinned photodiode is contained within said semiconductor film.

45. The sensor according to claim 39, including at least one detection module which includes said pinned photodiode.

46. The sensor according to claim 39, wherein said pinned photodiode is a component of an imaging system.

47. The sensor according to claim 46, wherein said imaging system is a Time of Flight (ToF) system.

48. The sensor according to claim 46, wherein said imaging system is a component of an electronic device.

49. The sensor according to claim 48, wherein the electronic device is selected from a group consisting of: a tablet and a cellular mobile phone.

50. An integrated optical sensor including a pinned photodiode, comprising:
- a semiconductor substrate including:
  - a first semiconductor region having a first type of conductivity;
  - a second semiconductor region having a second type of conductivity opposite to the first type of conductivity; and
  - a third semiconductor region having the second type of conductivity;
  - wherein said first semiconductor region is located between the second and third semiconductor regions;
  - wherein said third semiconductor region is thicker, less doped and located deeper in the semiconductor substrate than the second semiconductor region;
  - wherein said third semiconductor region includes silicon and germanium, with the germanium having a first concentration gradient;
  - wherein the third semiconductor region includes a depleted area and a non-depleted area, said depleted area being in contact with the first semiconductor region and located above the non-depleted area, and wherein the first concentration gradient is located in the non-depleted area; and
  - wherein said third semiconductor region further includes silicon and germanium in the depleted area, with the germanium having a second concentration gradient, wherein said second concentration gradient is a negative concentration gradient, with an atomic percentage of germanium in said depleted area decreasing from the non-depleted area towards the first semiconductor region.

51. The sensor according to claim 50, wherein the first concentration gradient is a positive gradient, with an atomic percentage of germanium in said third semiconductor region increasing from a bottom of the third semiconductor region towards the first semiconductor region.

52. The sensor according to claim 51, wherein the atomic percentage of germanium for said first concentration gradient increases from 0% to 6%.

53. The sensor according to claim 51, wherein the atomic percentage of germanium for said first concentration gradient increases from 3% to 6%.

54. The sensor according to claim 50, wherein the first concentration gradient is a positive gradient, with an atomic percentage of germanium in said non-depleted area increasing from a bottom of the non-depleted area towards the depleted area.

55. The sensor according to claim 54, wherein the atomic percentage of germanium for said first concentration gradient increases from 0% to 6%.

56. The sensor according to claim 54, wherein the atomic percentage of germanium for said first concentration gradient increases from 3% to 6%.

57. The sensor according to claim 50, wherein the atomic percentage of germanium decreases from 6% to 0% in the depleted area.

58. The sensor according to claim 50, wherein the third semiconductor region contains a silicon germanium alloy.

59. The sensor according to claim 50, wherein the first type of conductivity is N type and the second type of conductivity is P type.

60. The sensor according to claim 50, wherein the semiconductor substrate is a silicon-on-insulator type substrate which includes a buried insulating layer topped by a semiconductor film, and wherein said pinned photodiode is contained within said semiconductor film.

61. The sensor according to claim 50, including at least one detection module which includes said pinned photodiode.

62. The sensor according to claim 50, wherein said pinned photodiode is a component of an imaging system.

63. The sensor according to claim 62, wherein said imaging system is a Time of Flight (ToF) system.

64. The sensor according to claim 62, wherein said imaging system is a component of an electronic device.

65. The sensor according to claim 64, wherein the electronic device is selected from a group consisting of: a tablet and a cellular mobile phone.

66. An integrated optical sensor including a pinned photodiode, comprising:
   a semiconductor substrate including:
      a first semiconductor region having a first type of conductivity;
      a second semiconductor region having a second type of conductivity opposite to the first type of conductivity; and
      a third semiconductor region having the second type of conductivity;
   wherein said first semiconductor region is located between the second and third semiconductor regions;
   wherein said third semiconductor region is thicker, less doped and located deeper in the semiconductor substrate than the second semiconductor region;
   wherein said third semiconductor region includes silicon and germanium, with the germanium having a first concentration gradient;
   wherein the third semiconductor region includes a depleted area and a non-depleted area, said depleted area being in contact with the first semiconductor region and located above the non-depleted area, and wherein the first concentration gradient is located in the non-depleted area; and
   wherein said depleted area in the third semiconductor region does not include germanium.

67. The sensor according to claim 66, wherein the first concentration gradient is a positive gradient, with an atomic percentage of germanium in said third semiconductor region increasing from a bottom of the third semiconductor region towards the first semiconductor region.

68. The sensor according to claim 67, wherein the atomic percentage of germanium for said first concentration gradient increases from 0% to 6%.

69. The sensor according to claim 67, wherein the atomic percentage of germanium for said first concentration gradient increases from 3% to 6%.

70. The sensor according to claim 66, wherein the first concentration gradient is a positive gradient, with an atomic percentage of germanium in said non-depleted area increasing from a bottom of the non-depleted area towards the depleted area.

71. The sensor according to claim 70, wherein the atomic percentage of germanium for said first concentration gradient increases from 0% to 6%.

72. The sensor according to claim 70, wherein the atomic percentage of germanium for said first concentration gradient increases from 3% to 6%.

73. The sensor according to claim 66, wherein the third semiconductor region contains a silicon germanium alloy.

74. The sensor according to claim 66, wherein the first type of conductivity is N type and the second type of conductivity is P type.

75. The sensor according to claim 66, wherein the semiconductor substrate is a silicon-on-insulator type substrate which includes a buried insulating layer topped by a semiconductor film, and wherein said pinned photodiode is contained within said semiconductor film.

76. The sensor according to claim 66, including at least one detection module which includes said pinned photodiode.

77. The sensor according to claim 66, wherein said pinned photodiode is a component of an imaging system.

78. The sensor according to claim 77, wherein said imaging system is a Time of Flight (ToF) system.

79. The sensor according to claim 77, wherein said imaging system is a component of an electronic device.

80. The sensor according to claim 79, wherein the electronic device is selected from a group consisting of: a tablet and a cellular mobile phone.

* * * * *